United States Patent
Bentz et al.

(10) Patent No.: US 6,185,100 B1
(45) Date of Patent: Feb. 6, 2001

(54) CONTROL DEVICE CONSISTING OF AT LEAST TWO HOUSING SECTIONS

(75) Inventors: Willy Bentz, Sachsenheim; Peter Jares, Sindelfingen; Dieter Karr, Tiefenbronn; Paul Hermanutz, Gomaringen; Waldemar Ernst, Vaihingen/Enz, all of (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/101,434

(22) PCT Filed: Dec. 20, 1996

(86) PCT No.: PCT/DE96/02500
§ 371 Date: Jan. 25, 1999
§ 102(e) Date: Jan. 25, 1999

(87) PCT Pub. No.: WO97/25846
PCT Pub. Date: Jul. 17, 1997

(30) Foreign Application Priority Data

Jan. 10, 1996 (DE) .............................................. 196 00 619

(51) Int. Cl.[7] .................................................. H05K 7/20
(52) U.S. Cl. ......................... 361/704; 361/702; 361/707; 361/719; 361/737; 257/706; 257/707; 165/80.3; 165/185; 174/16.3; 174/52.1
(58) Field of Search .................................... 361/704–707, 361/812, 702–713, 715–722, 730, 734–736, 752, 737–741, 816–818, 749; 174/163, 25 R, 252, 35 MS, 52.1; 257/706–727; 165/80.2, 80.3, 80.4, 185

(56) References Cited

U.S. PATENT DOCUMENTS

| 5,111,362 | * | 5/1992 | Flamm et al. | 361/395 |
| 5,379,188 | * | 1/1995 | Winslow | 361/760 |
| 5,402,313 | * | 3/1995 | Casperson et al. | 361/710 |
| 5,590,026 | * | 12/1996 | Warren et al. | 361/704 |
| 5,812,375 | * | 9/1998 | Casperson | 361/707 |

FOREIGN PATENT DOCUMENTS

| 92 00 624 U | | 7/1993 | (DE) . | |
| 000652694A1 | * | 11/1993 | (DE) | H05K/5/00 |
| 19528632 A1 | * | 8/1995 | (DE) | H05K/7/20 |

* cited by examiner

Primary Examiner—Leo P. Picard
Assistant Examiner—Michael Datskovsky
(74) Attorney, Agent, or Firm—Michael J. Striker

(57) ABSTRACT

In a control device the printed circuit board (10) rests on a rim (28) of the housing bottom (26). The power components (14) to be cooled are arranged in the area where the printed circuit board (10) rests on the rim (28). In order to achieve an even contact pressure of the printed circuit board (10) over the entire support surface, a contact pressure on the power component (14) or on the printed circuit board (10) is generated with the help of additional aids. It is possible here to use spring elements (30) or elastomer strips (31) acting on the power component (14). Furthermore, multi-part support elements (40), or respectively plastic elements (45) can also be employed, which respectively act directly on the printed circuit board (10). A good heat dissipation from the power component (14) via the rim (28) of the housing bottom is possible by means of this.

29 Claims, 3 Drawing Sheets

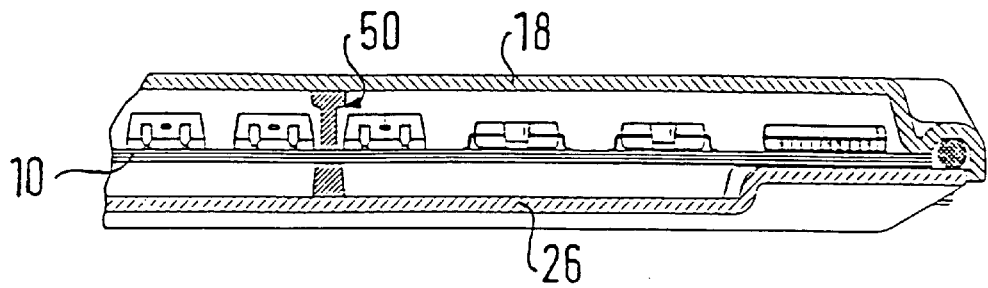
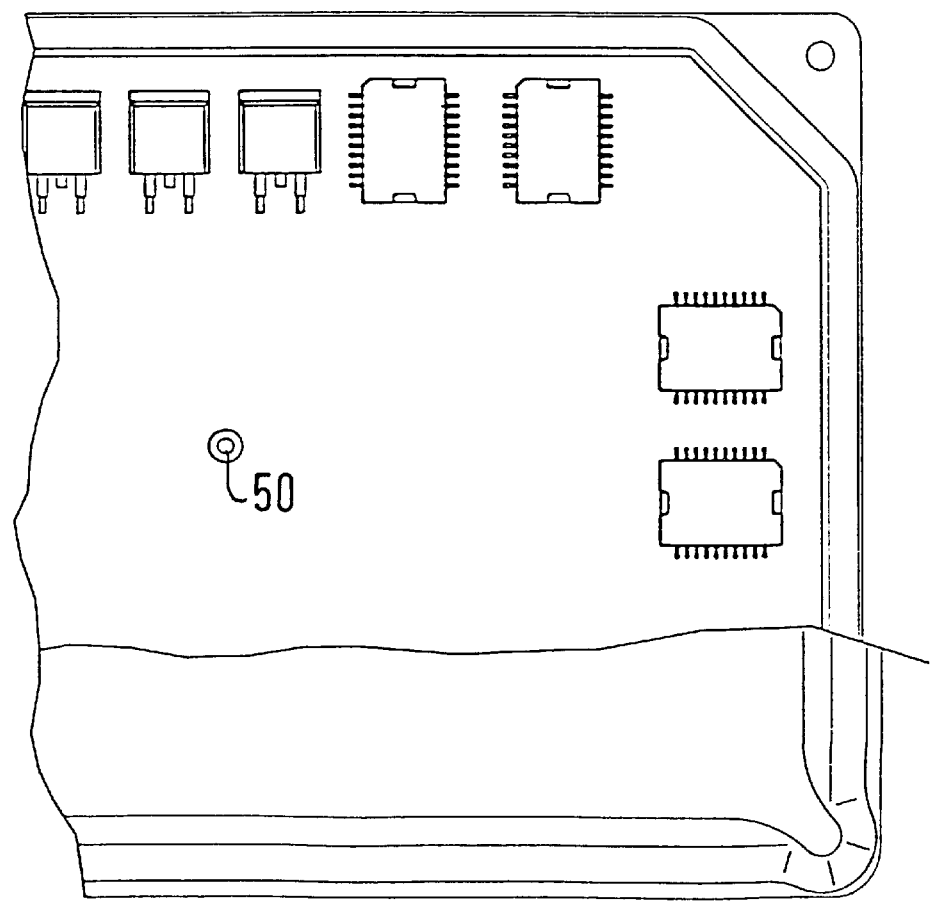

CONTROL DEVICE CONSISTING OF AT LEAST TWO HOUSING SECTIONS

The invention relates to a control device consisting of at least two housing sections in accordance with the species of the independent claims. With a control device known from DE-Gbm 92 006 24.8, a printed circuit board is fixedly inserted with the aid of screw connections between two housing sections, i.e. a housing cover and a housing bottom. The housing cover and the housing bottom are made of a material with good heat conductivity. In order to be able to dissipate the waste heat from the power components arranged on the printed circuit board via the housing elements, the printed circuit board is provided with a heat-conducting layer, for example a copper lining or a heat-conducting layer. However, the latest power components in particular generate such intensive waste heat that it is very difficult to dissipate it to the exterior with the aid of the conventional heat conducting layer and the customary structural layout. With other control device concepts, the entire underside of the substrate supporting the power components is provided with a heat-dissipation layer for dissipating the heat. Therefore this side of the printed circuit board can no longer be equipped with power components, which results in an increase in surface requirements and therefore an increase in cost.

BACKGROUND OF THE INVENTION

In contrast thereto, the control device in accordance with the invention has the advantage that there is a relatively low thermal transfer resistance between the printed circuit board and the support surfaces of the housing bottom being used as cooling element. It is possible in a simple and cost-effective manner to generate a contact pressure force of the printed circuit board on the cooling element by means of the mechanical aids. If required, a heat-conducting adhesive can also be applied between the support surface of the housing bottom and the underside of the printed circuit board, by means of which the thermal conductivity is once more optimized. The contact pressure force can be generated by simple structural effects, because of which the device can be produced at very favorable cost. A limitation to specific printed circuit boards is not necessary. Further, with the exception of the support area of the printed circuit board on the housing section, equipping with components on both sides is possible in a simple manner.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

Exemplary embodiments of the invention are represented in the drawings and are explained in more detail in the following description. FIGS. 1 to 5 respectively show a section through a schematic representation of a portion of the control device.

DESCRIPTION OF THE EXEMPLARY EMBODIMENTS

Figure 1:
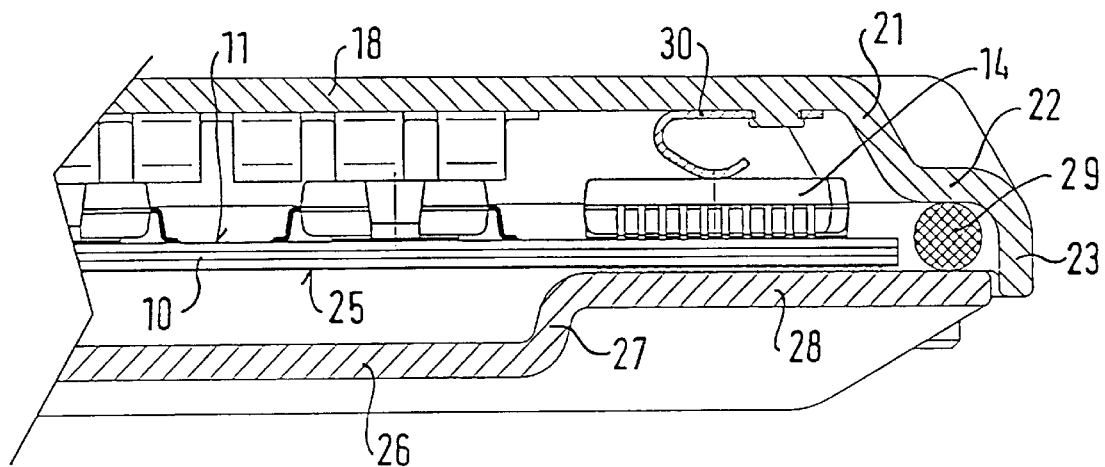

The electrical switching or control device has a printed circuit board 10, on the top 11 of which an electronic circuit has been constructed, of which only a few electronic components 14, which give off waste heat during operation, are represented. In the drawings these components 14 are shown as SMD components (surface mounted device). In a manner not shown, the printed circuit board 10 is connected with a connector strip.

The top 11 of the printed circuit board 10 is covered by a tub-shaped housing cover 18. Except for the area of the connector strip, the housing cover 18 has a continuous, collar-shaped rim 22 on its housing walls 21. As shown in FIG. 1, here the printed circuit board 10 can extend about as far as the lateral wall 21. Because of this, the components 14 can be arranged up to the edge of the printed circuit board 10. However, it is also possible to keep the edge of the printed circuit board 10 free of circuit components and strip conductors, so that this edge of the printed circuit board 10 extends as far as underneath the rim 22 of the housing cover 18.

The continuous rim 22 has a beveled edge 23 extending approximately perpendicular in respect to the rim 22 and projecting past the front face of the printed circuit board 10.

The underside 25 of the printed circuit board 10 is enclosed by an also tub-shaped housing bottom 26, whose lateral walls 27 have a continuous, collar-shaped rim 28, which indirectly or directly rests against the outer area of the underside 25 of the printed circuit board 10. The power components 14, whose heat has to be dissipated, preferably also rest on the printed circuit board 10 in this rim area 28. In FIG. 1, the rim 28 ends approximately flush with the edge 23 of the housing cover 18, so that with the aid of a sealing ring 29, the printed circuit board 10 is enclosed between the housing cover 18 and the housing bottom 26, i.e. between the rim 22 of the housing cover 18 and the rim 28 of the housing bottom 26. The housing cover 18 and the housing bottom 26 are fastened for example by means of several screws arranged at the corners of the housing. However, in place of the mentioned screw connection, the housing elements can also be firmly connected by means of gluing, soldering, crimping, riveting, with locking elements or other connecting techniques. The housing cover 18 and the housing bottom 26 are preferably made of a material with good heat conductivity. It is important here that the support surface of the housing bottom 26, i.e. of the rim 28 on the printed circuit board 10, is of sufficient size so that it is possible to at least arrange the power components 14 emitting the most waste heat on the side of the printed circuit board 10 lying above. By means of this a direct heat dissipation from the power component 14 through the printed circuit board 10 to the rim 28 of the housing bottom 26, and thus to the outside, is possible. In order to achieve good heat conductivity, the printed circuit board 10 is connected with the aid of an adhesive 12 with heat-conducting properties. This adhesive also has adhesive properties in order to achieve a good connection, or respectively fixation of the printed circuit board 10 on the rim 28 of the housing cover 26 during mounting of the control device.

If now the printed circuit board 10 is firmly clamped between the housing cover 18 and the housing bottom 26 with the aid of the screw connections, not represented, it is possible that because of the screw connections, which can only be applied to the edge, a wedge-shaped gap is created between the rim 28 and the underside 25 of the printed circuit board 10. Starting at the outer edge of the rim 28, i.e. viewed from the edge 23, this wedge-shaped gap continues to become wider toward the inside of the housing. Even if this is only a minimal gap formation, a different thermal dissipation, i.e. a different thermal dissipation resistance, is generated in this case on the rim 28 over the entire support surface of the printed circuit board 10. The larger this gap, the worse the heat dissipation from the power components 14 to the housing elements 18 and 26. This different thermal dissipation can have negative effects on the ability of the power components 14 to function. It can therefore be necessary to push the printed circuit board, i.e. indirectly the power components 14, evenly on the rim 28 of the housing bottom 26. To this end a contact pressure force on the power components, or respectively the printed circuit board 10, is generated with additional mechanical aids. However, when using these mechanical aids it is also necessary to take the optimization of the costs incurred because of this into consideration. In FIG. 1, the power component 14 is pushed on the printed circuit plate 10, and the latter in turn evenly on the rim 28, with the aid of an additional spring element 30. In this case the contact pressure of the spring element 30 acts directly on the power component 14 in question and in this way assures an even support surface of the rim 28 on the printed circuit board 10. As mentioned, the spring element 30 rests with one side on the power component 14 and with the other side on the inside of the housing cover 18. This spring element 30 can for example be riveted to the inside of the housing cover 18. In order to make a simple assembly possible, the power component 14 should possibly be pushed by only a few, i.e. in the optimal case only by one spring element 30. Furthermore, to achieve an even distribution of the contact pressure, the spring element 30 should rest centered on the power component 14. If the individual pressing of a single power component 14 is desired, the spring element 30 should rest approximately centered on the power component 14. However, if several power components 14 are arranged one behind the other in a row at the edge of the printed circuit board 10, it is possible to use an elongated, divided spring element, which rests approximately centered on the power components 14.

Figure 2:
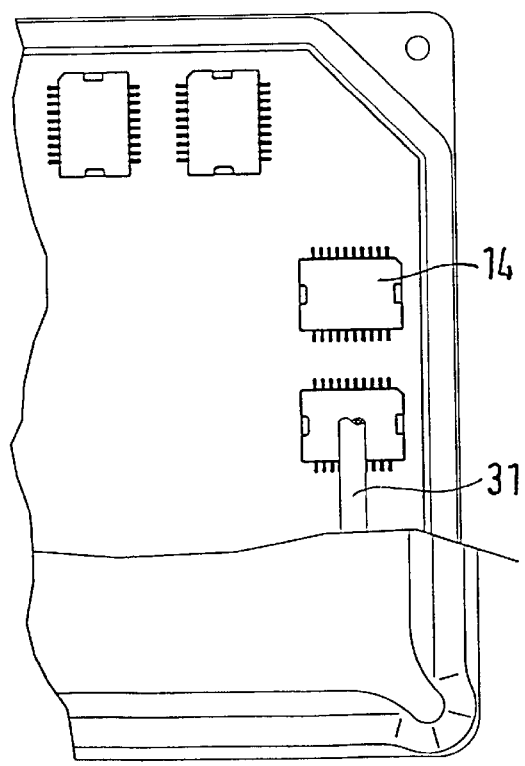
Figure 2A:
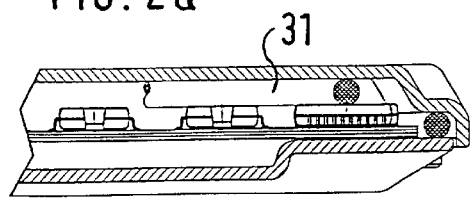

The embodiment of the control device in accordance with FIG. 2 corresponds to that in FIG. 1. A variation of the mechanical aid for pressing the power component down is shown in FIG. 2. An elastic component made of plastic is employed in FIG. 2. This is represented as an elastomer strip 31 in FIG. 2. This elastomer strip 31 can have a circular, rectangular or any other cross section, by means of which an even contact pressure on the power component 14 is achieved. In this case the elastomer strip 31 can be glued to the inside of the housing cover 18, so that after assembly it rests approximately centered on the power components 14.

Figure 3:
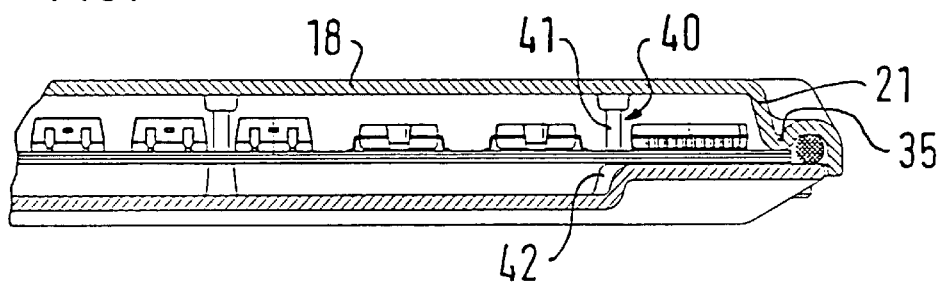

In the exemplary embodiment of FIG. 3, the printed circuit board 10 is clamped with the aid of a bead 35 formed in the housing cover 18 between the lateral wall 21 and the rim 22. This results in the clamping of the printed circuit board 10 between the housing cover 18 and the housing bottom 26. In connection with the exemplary embodiments in accordance with FIGS. 3 and 4, the printed circuit board 10 is pressed directly on the rim 28 of the housing bottom 26, without letting a contact pressure act on the power components 14. To this end, an additional support element is provided on the side of the power component 14 facing away from the rim 21. This support element is embodied as a mechanical post 40 in FIG. 3. A first post element 41 here is arranged between the inside of the housing cover 18 and the printed circuit board 10, and a second post element 42 between the inside of the housing bottom 26 and the underside of the printed circuit board 10. In this case the height of the second post element 42 must be matched to the height of the lateral wall 27 of the housing bottom 26. The same applies to the first housing element 41, which must be matched to the height of the lateral wall 21. Several support elements 40 have been arranged, evenly distributed over the printed circuit board, to achieve an even contact pressure. But these support elements 40 are located as close as possible near the rim 28. This embodiment is particularly advantageous in connection with cast housing elements, since the first and second support elements 41, 42 can already be cast on the housing cover 18, or respectively the housing bottom 26, during casting.

Figure 4:
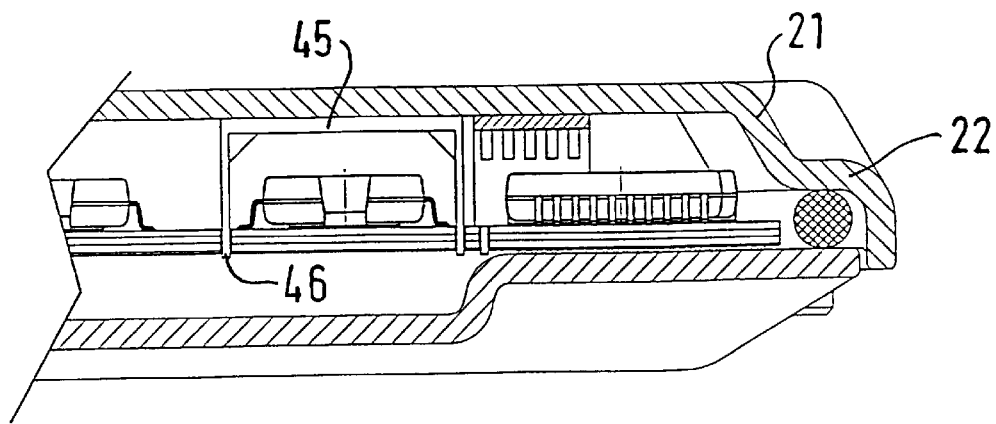

If the support element is intended to be again embodied as an elastic plastic element, it has a hat-shaped or arc-shaped form, as represented in FIG. 4. In this case the plastic element 45 presses the printed circuit board 10 on the rim 28. It furthermore rests with the greatest possible surface against the inner wall of the housing cover 18. Bores 46 are provided in the printed circuit board 10 for fixing the plastic element 45 in place.

In the exemplary embodiment in accordance with FIG. 5, or respectively FIG. 5a, the mechanical aid 50 is arranged between the printed circuit board 10 and the housing cover 18, or respectively the housing bottom 26. In this case the aid 50 does not act on the power components 14. The aid 50 consists of a bottom element 51 located between the printed circuit board 10 and the housing bottom 26, and a counter element 52, which is arranged between the printed circuit board 10 and the housing cover 18. As can be seen from FIG. 5a, the aid 50 has been arranged to rest approximately centered on the printed circuit board 10. It is also possible to embody the aid only as one piece, so that there is either only a bottom element or a counter element. The aid can be an additionally inserted element, or can be embodied on the inside of the housing bottom 26 or the housing cover 18. The aid can be attached by screwing, locking or it can lie flat. The aid represented in accordance with FIG. 5 is possible with the embodiment of the control device in FIGS. 1 and 2, as well as with the embodiment of the control device in FIGS. 3 and 4. The aid can be arranged in addition to the means represented in these exemplary embodiments, or it can replace these means.

What is claimed is:

1. A control device, comprising at least two housing elements including a lower housing element and an upper housing element; at least one printed circuit board equipped with power components, said printed circuit board resting on said lower housing element in direction thermal communication with the latter, with an area which is greater or equal to a support surface of at least one power component to be cooled; a mechanical aid provided between said at least one power component to be cooled and said upper housing element, so that an even rest of said lower housing element is provided on said printed circuit board in direct thermal communication with the latter, at least in an area of said at least one power component to be cooled.

2. A control device as defined in claim 1, wherein said aid is a spring element.

3. A control device as defined in claim 1, wherein said aid is a plastic element.

4. A control device as defined in claim 1, wherein said aid is an elastomer strip.

5. A control device as defined in claim 1, wherein said aid is an extension which projects from an inside of said first housing elements toward said printed circuit board.

6. A control device as defined in claim 1; and further comprising a counter element provided on a side of said printed circuit board facing said second housing element.

7. A control device as defined in claim 6, wherein said counter element is an extension on said second housing element.

8. A control device as defined in claim 1, wherein said aid is a cup-shaped plastic element.

9. A control device, comprising at least two housing elements including a lower housing element and an upper housing element; at least one printed circuit board equipped with power components, said printed circuit board resting on said lower housing element in direct thermal communication with the latter, with an area which is greater or equal to a support surface of at least one power component to be cooled, said printed circuit board being clamped between said upper housing element and said lower housing element; a mechanical aid provided between said printed circuit board and said upper housing elements, so that an even rest of an area of said lower housing element on said printed circuit board is provided in direct thermal communication with the latter.

10. A control device as defined in claim 9, wherein said aid is a spring element.

11. A control device as defined in claim 9, wherein said aid is a plastic element.

12. A control device as defined in claim 9, wherein said aid is an elastomer strip.

13. A control device as defined in claim 9, wherein said aid is an extension which projects from an inside of said first housing elements toward said printed circuit board.

14. A control device as defined in claim 9; and further comprising a counter element provided on a side of said printed circuit board facing said second housing element.

15. A control device as defined in claim 14, wherein said counter element is an extension on said second housing element.

16. A control device as defined in claim 9, wherein said aid is a cup-shaped plastic element.

17. A control device, comprising at least two housing elements; at least one printed circuit board equipped with power components, said printed circuit board resting on at least one of said housing elements with an area which is greater or equal to a support surface of at least one power component to be cooled; a mechanical aid arranged between said printed circuit board and any of said housing elements, so that an even rest of an area of a second one of said housing elements is provided.

18. A control device as defined in claim 17; and further comprising a counter element provided between said printed circuit board and any of said housing elements.

19. A control device as defined in claim 17, wherein said aid is centered on said printed circuit board.

20. A control device as defined in claim 17, wherein said aid is a spring element.

21. A control device as defined in claim 17, wherein said aid is a plastic element.

22. A control device as defined in claim 17, wherein said aid is an elastomer strip.

23. A control device as defined in claim 17, wherein said aid is an extension which projects from an inside of said first housing elements toward said printed circuit board.

24. A control device as defined in claim 17; and further comprising a counter element provided on a side of said printed circuit board facing said second housing element.

25. A control device as defined in claim 17, wherein said counter element is an extension on said second housing element.

26. A control device as defined in claim 17, wherein said aid is a cup-shaped plastic element.

27. A control device as defined in claim 1, wherein said printed circuit board at least partially has a layer of a heat-conducting material.

28. A control device as defined in claim 9, wherein said printed circuit board at least partially has a layer of a heat-conducting material.

29. A control device as defined in claim 17, wherein said printed circuit board at least partially has a layer of a heat-conducting material.

* * * * *